(12) United States Patent
Chen

(10) Patent No.: US 7,905,176 B2
(45) Date of Patent: Mar. 15, 2011

(54) AUTOMATIC REGISTRATION DEVICE

(75) Inventor: Tung-Chin Chen, Taipei (TW)

(73) Assignee: ATMA Champ Enterprise Corporation, Taipei (TW)

( * ) Notice: Subject to any disclaimer, the term of this patent is extended or adjusted under 35 U.S.C. 154(b) by 393 days.

(21) Appl. No.: 12/237,886

(22) Filed: Sep. 25, 2008

(65) Prior Publication Data
US 2010/0033606 A1 Feb. 11, 2010

(30) Foreign Application Priority Data

Aug. 7, 2008 (TW) .............................. 97130136 A

(51) Int. Cl.
*B41F 15/18* (2006.01)
*B41F 15/26* (2006.01)
*B41F 15/12* (2006.01)
(52) U.S. Cl. .......................... 101/126; 101/481; 101/114
(58) Field of Classification Search .................. 101/114, 101/126, 129, 481, 485, 486, DIG. 36
See application file for complete search history.

(56) References Cited

U.S. PATENT DOCUMENTS

| | | | | |
|---|---|---|---|---|
| 5,241,187 A | * | 8/1993 | Ikeda et al. | 250/548 |
| 5,901,646 A | * | 5/1999 | Walker et al. | 101/123 |
| 7,580,558 B2 | * | 8/2009 | McEvoy et al. | 382/151 |
| 2005/0166772 A1 | * | 8/2005 | Schanz | 101/126 |

* cited by examiner

*Primary Examiner* — Leslie J Evanisko
(74) *Attorney, Agent, or Firm* — Muncy, Geissler, Olds & Lowe, PLLC

(57) ABSTRACT

An automatic registration device applied to screen printing machines includes a base disposed under the printing table and is arranged with at least three sets of CCD (Charge Coupled Device), a printing table and an automatic registration member. The two sets of CCD are arranged on one side of the base while the other one set of CCD is disposed on the other side. The printing table is for loading and positioning the articles to be printed and is disposed with through holes corresponding to the image capture devices respectively as well as light sources for emitting light upward and the light passing through the insertion hole. The automatic registration member with a screen is arranged over the printing table. The CCD takes images of the article to be printed and the screen at the same time by the through hole. Through the computer, the automatic registration member and the screen move synchronously for accurate positioning to the article to be printed.

10 Claims, 7 Drawing Sheets

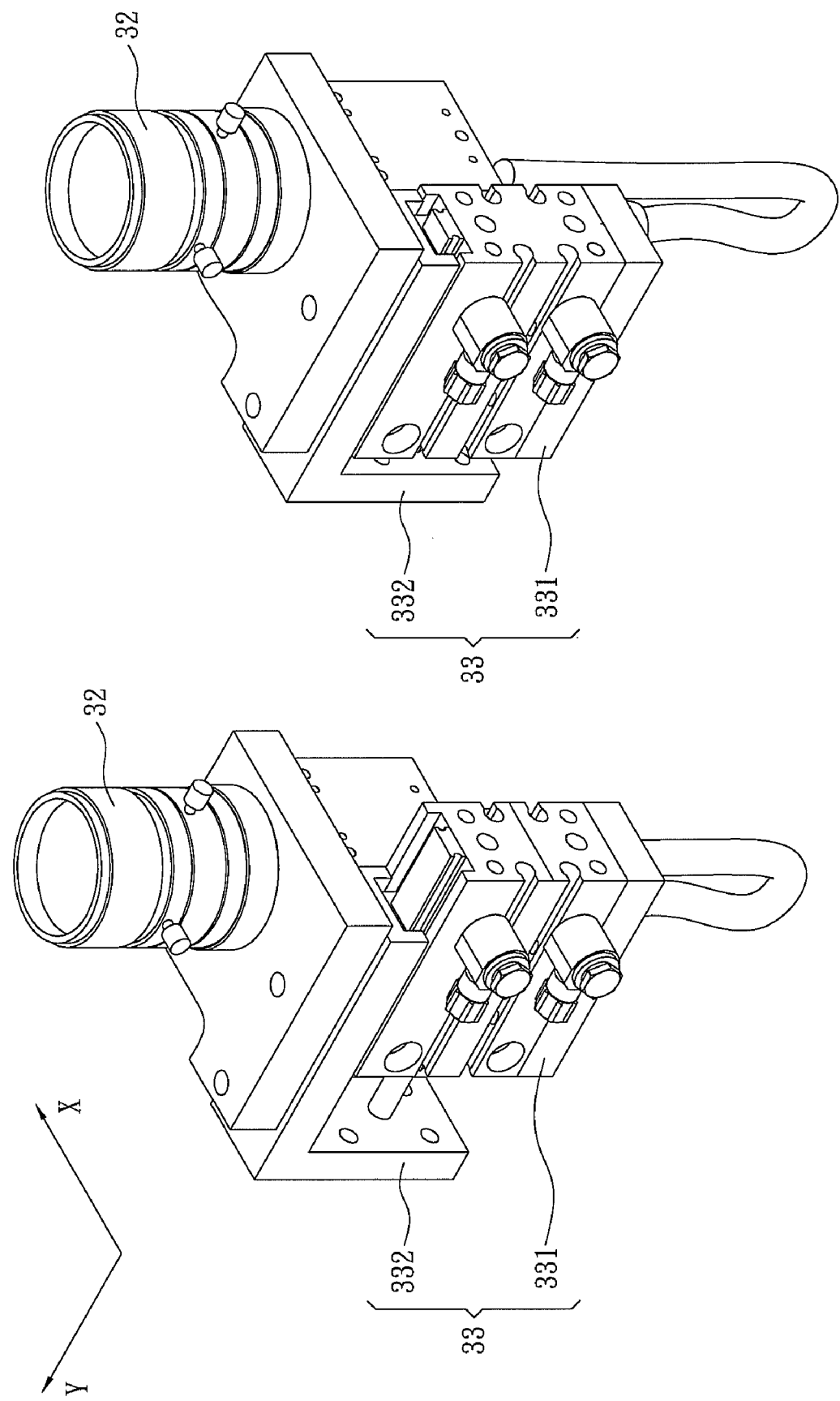

AUTOMATIC REGISTRATION DEVICE

BACKGROUND OF THE INVENTION

The present invention relates to an automatic registration device, especially to a registration device applied to a screen printing machine for facilitating accurate positioning between screens and articles to be printed.

In early days, the positioning between the screens and the articles to be printed is operated manually and checked by visual checking. Thus the accurate positioning required several times of operation. Thus the manual/visual checking of the registration result goes on slowly, consumes more labors and increases the cost. Moreover, such way is easy to have errors so that the quality is reduced and this will cause damage.

In order to improve printing quality, a new type screen printing machine includes a plurality of image capture devices such as CCD (Charge Coupled Device) disposed over a printing table so as to take pictures of an article to be printed set on the printing table. The positioning result is shown on a screen, checked by eye, and adjusted by manual adjustment. However, such registration can't meet requirements of precise and quick positioning, less time and labor consumption, and high production efficiency. Moreover, CCD over the printing table is easily to be interfered with a printing head above the printing table, operation of the screen, and movement of operators. Furthermore, the printing operation line: firstly performs imaging and positioning of the printed article on an imaging area of the printing table

SUMMARY OF THE INVENTION

Therefore it is a primary object of the present invention to provide an automatic registration device applied to a screen printing machine for facilitating accurate positioning between screens and articles to be printed. The automatic registration device includes a base, a printing table and an automatic registration member. The base is disposed under the printing table and a support seat on the center of the base is for connecting and supporting a bottom of the printing table. At least three sets of image capture devices such as CCD (Charge Coupled Device) for taking pictures are arranged on an outer circumference of the support seat of the base. Two sets of image capture devices are disposed on one side of the rectangular base while the other one set of image capture device is disposed on the other side of the rectangular base. The printing table is for loading and positioning the articles to be printed and is disposed with a plurality of through holes corresponding to the image capture devices respectively on the base and a light source is disposed on circumference of the bottom of the printing table, corresponding to each image capture device, for emitting light upward and providing light to the CCD. The automatic registration member is arranged over the printing table and is disposed with a screen that moves synchronously therewith. The screen is with a target corresponding to another target on the article to be printed. By the automatic registration member, the screen is synchronously driven to move in the X, Y, Y directions of the plane. The article to be printed is set on the printing table and is partially overlapped with the through hole. The above-mentioned CCD takes images of the target of the article to be printed and the target of the screen simultaneously through the through hole. The data of the image is sent to a computer and is calculated by the computer so as to drive the automatic registration member and the screen thereon moves synchronously in the X, Y, Y directions of the plane. Thus the target of the screen is quickly and accurately positioned to the target of the article to be printed. Therefore, the positioning between the screen and the article to be printed on the printing table of the screen printing machine is achieved automatically, quickly and accurately.

It's another object of the present invention to provide an automatic registration device that is disposed with five sets of CCD on the base thereof. Two sets of CCD are disposed on one sides of the rectangular base while the other three sets of CCD are arranged on the other three sides of the rectangular base respectively so as to achieve more accurate positioning.

BRIEF DESCRIPTION OF THE DRAWINGS

FIG. 7A is a schematic drawing showing an image capture device moving to the left according to the present invention;

FIG. 7B is a schematic drawing showing an image capture device moving to the right according to the present invention;

DETAILED DESCRIPTION OF THE PREFERRED EMBODIMENT

Figure 1:
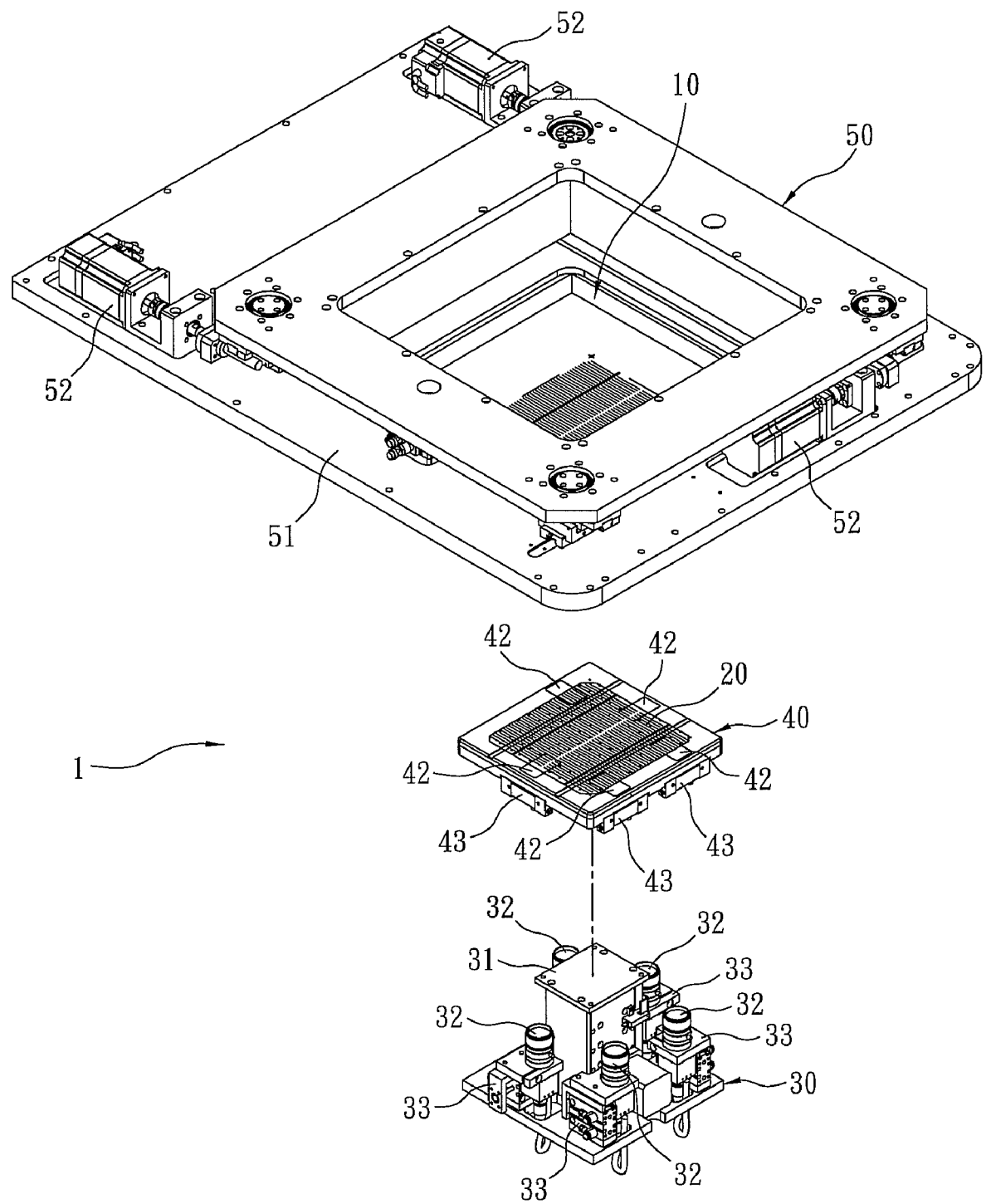
FIG. 1 is an explosive view of an embodiment according to the present invention.
Figure 2:
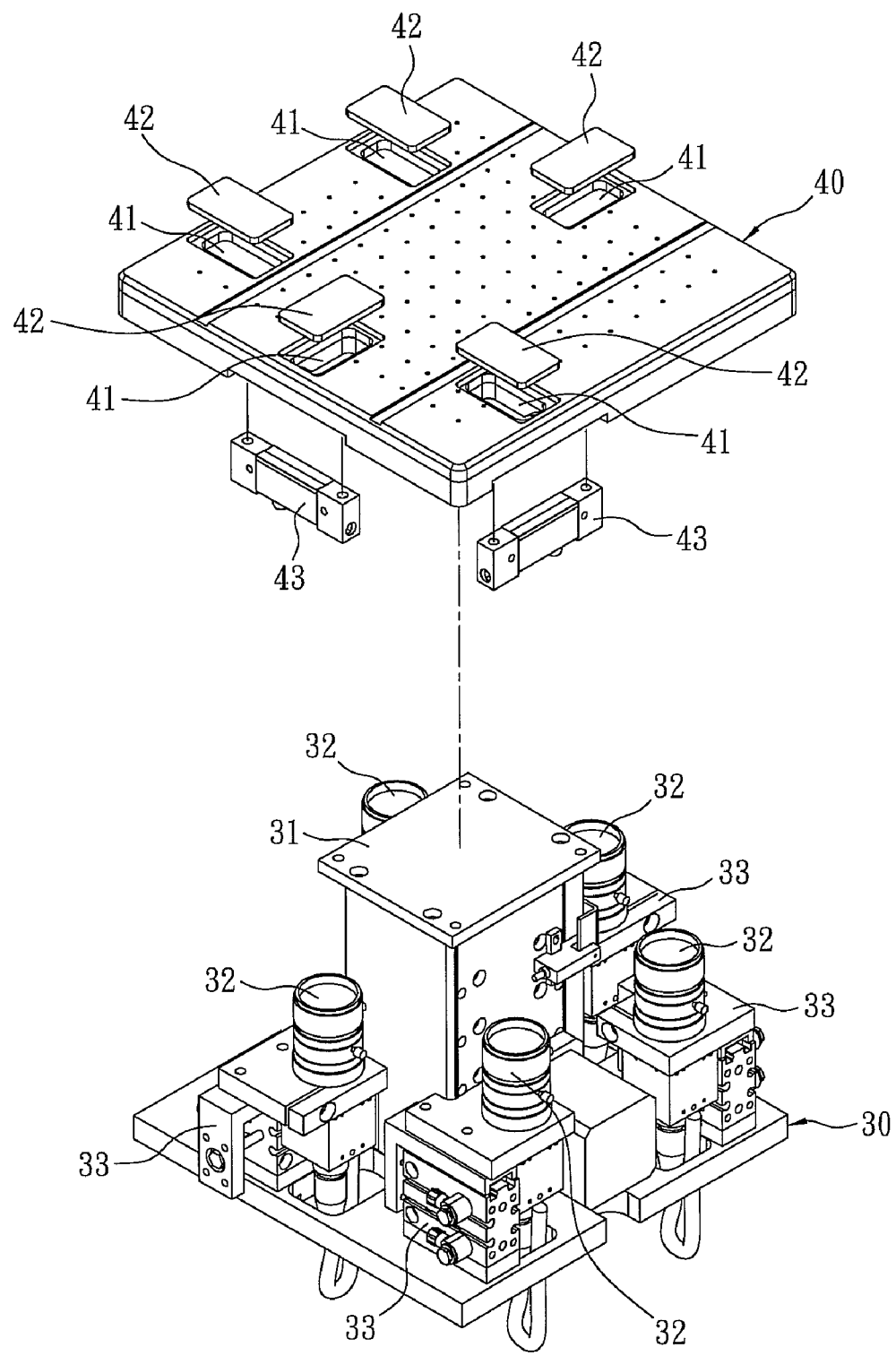
FIG. 2 a perspective view of a base and a printing table according to the present invention.
Figure 3:
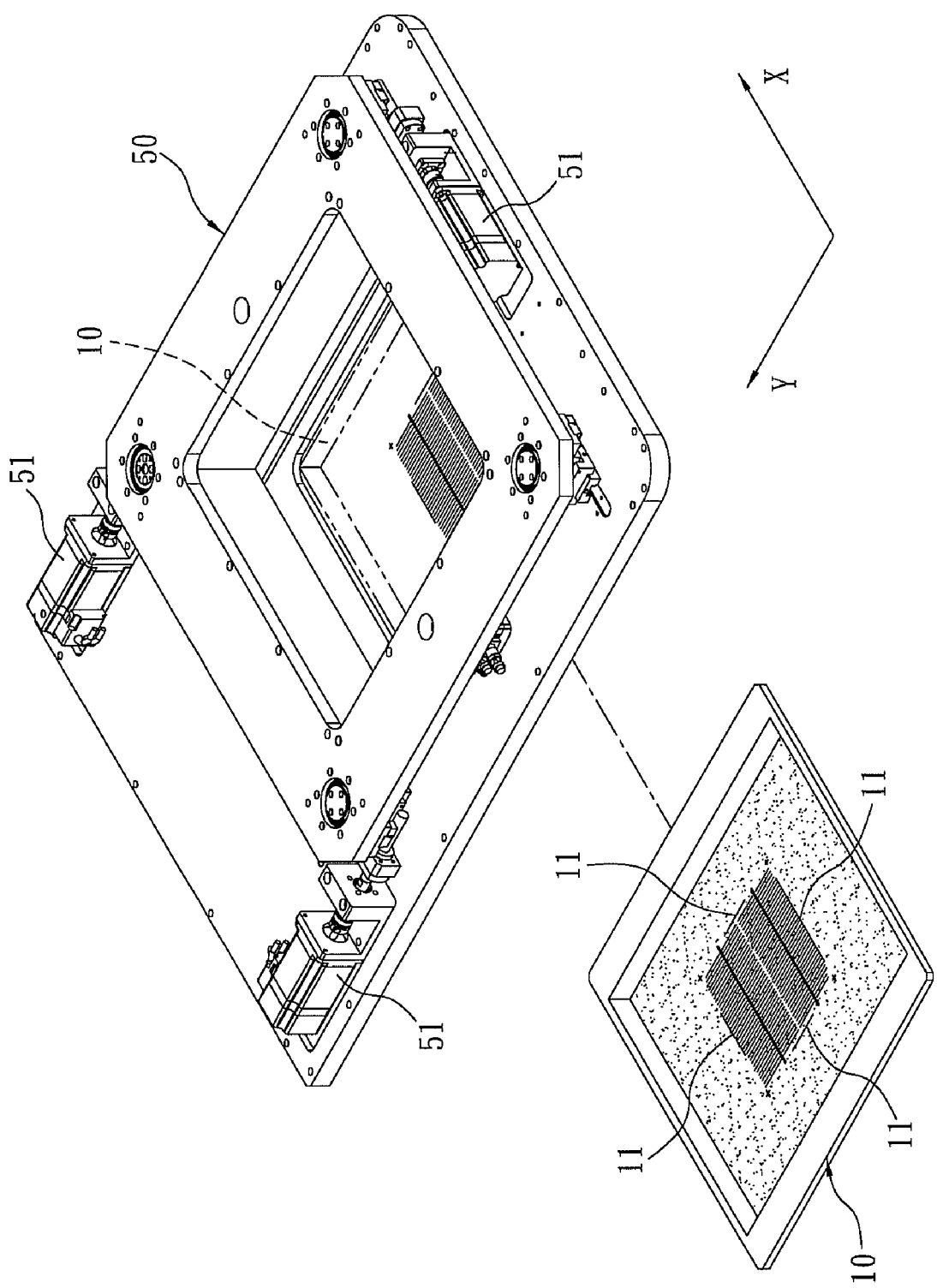
FIG. 3 is a perspective view of an automatic registration member and a screen according to the present invention.

Refer from FIG. 1 to FIG. 6, an automatic registration device 1 applied to screen printing machines for accurate positioning between a screen 10 and an article to be printed 20. The automatic registration device 1 includes a base 30, a printing table 40 and an automatic registration (locomotion) member 50. The base 30 is disposed under the printing table 40. A support seat 31 is on the center of the base 30 for connecting and supporting a bottom of the printing table 40. At least three sets of image capture devices 32 such as CCD (Charge Coupled Device) for taking pictures are arranged on an outer circumference of the support seat 31 of the base 30. The two sets of image capture devices 32 are disposed on one side of the rectangular base 30 and the other one set of image capture device 32 is disposed on the other side of the rectangular base 30. Refer to FIG. 2, the base 30 is disposed with five sets of image capture devices 32. Two sets of the image capture devices 32 are disposed on one side of the rectangular base 30 while the other three sets are arranged on the other three sides respectively. Moreover, each image capture device 32 is further disposed with a shifting member 33, as shown in FIG. 7A & FIG. 7B. The shifting member 33 consists of a pneumatic cylinder 331 and a sliding part 332. By extension and contraction movement of the pneumatic cylinder 331, the image capture device 32 is driven to move inside the sliding part 332. Thus each image capture device 32 moves along the X direction or the Y direction on a plane of the base 30 for corresponding to the article to be printed 20 with various sizes and printing targets thereon.

Figure 4:
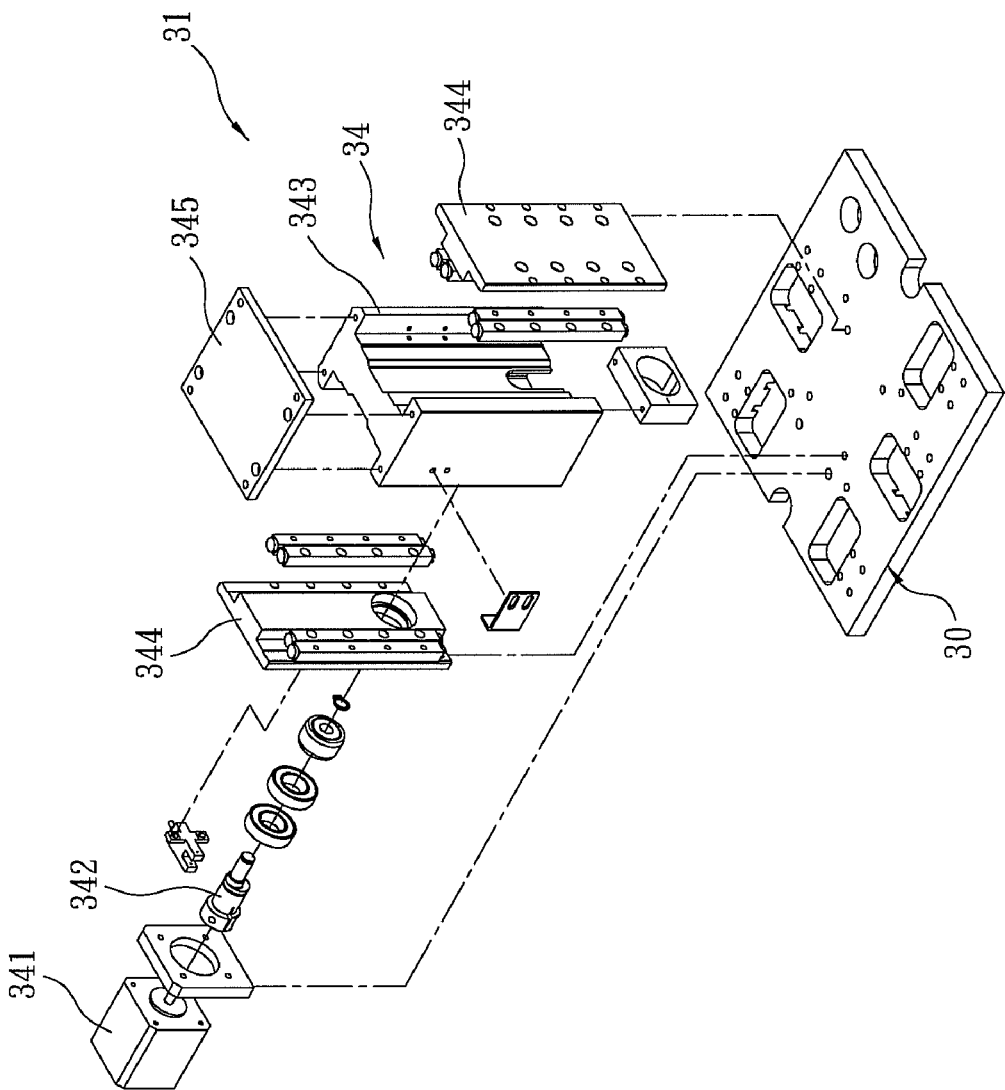
FIG. 4 is an explosive view of a support seat according to the present invention.
Figure 6:
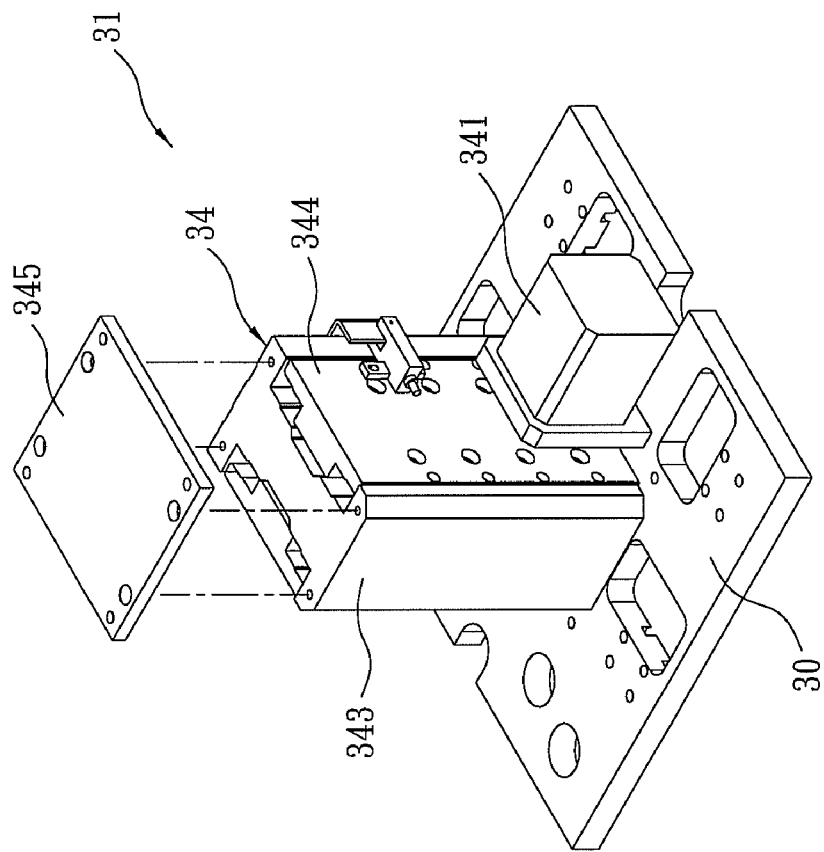
FIG. 6 is a perspective view of a lift mechanism while descending according to the present invention.
Figure 5:
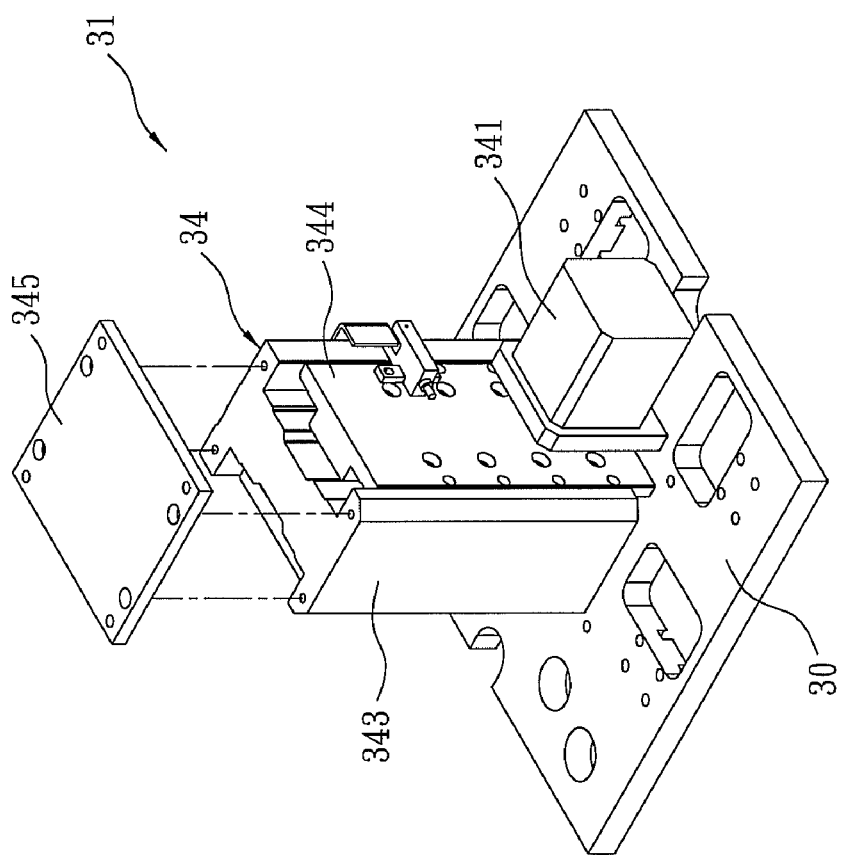
FIG. 5 is a perspective view of a lift mechanism while climbing according to the present invention.

Refer from FIG. 4 to FIG. 6, the support seat 31 further includes a lift mechanism 34 having a motor 341, a crankshaft 342, a sliding seat 343, two fixed seats for rail 344 and a top plate 345 connecting and corresponding to the bottom of the printing table 40. By the synchronous driving of the motor 341, the crankshaft 342 is driven to make the sliding seat 343 move upward/downward in the two fixed seats for rail 344, as shown in FIG. 5 & FIG. 6.

Refer back to FIG. 1 & FIG. 2, the printing table 40 is for loading and positioning the articles to be printed 20 and is disposed with a plurality of through holes 41 corresponding to each image capture device 32. In this embodiment, there are five through holes 41 arranged on the printing table 40, corresponding to five sets of image capture devices 32. Each through hole 41 is disposed with a transparent member 42 made from transparent glass, crystal glass, or acrylic. A light source 43 such as a stroboscopic light source is disposed on circumference of the bottom of the printing table 40, corresponding to each image capture device 32, for providing light stably so as to avoid errors in image data caused by influence of other light sources or shadows. The printing table 40 can move up/down synchronously by the lift mechanism 34 of the support seat 31.

The automatic registration member 50 assembled with a screen 10 is disposed over the printing table 40. The screen 10 is arranged with a target 11 corresponding to a target of the article to be printed 20. By the automatic registration member 50, the screen moves synchronously in the X, Y, Y directions of a plane. Moreover, there are a plurality of drivers 52 such as servomotor or stepper motor along X and Y directions arranged on a base 51 of the automatic registration member 50 so that the automatic registration member 50 with the screen 10 thereon is synchronously driven by the driver 52 and is moving into the X, Y, Y directions.

Figure 8:
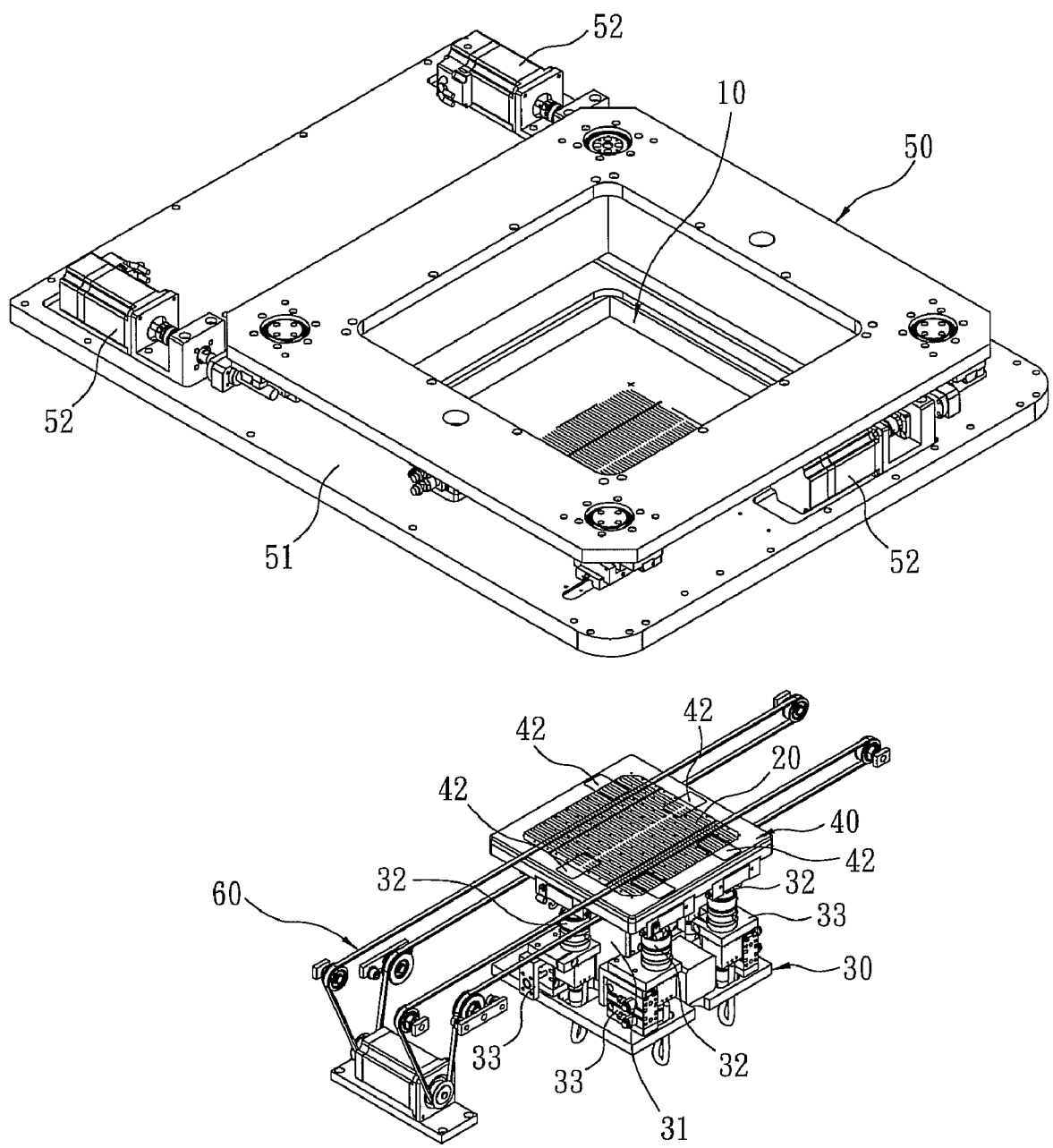
FIG. 8 shows an embodiment of the present invention in usage.

Refer to FIG. 8, the automatic registration device 1 of the present invention is used in combination with a transport part 60 of a screen printing machine. In usage, the article to be printed 20 is moved to the printing table 40 by the transport part 60 and the article to be printed 20 is partially overlapped with the through hole 41 (transparent member 42). Then by vacuum pumping, the article to be printed 20 is attached and located on the printing table 40. Next the printing table 40 moves up synchronously by the lift mechanism 34 so as to separate the article to be printed 20 with the transport part 60. The at least three sets of image capture devices 32 take images toward the target of the article to be printed 20 and the target 11 of the screen 10. The data of the captured images is sent to a computer and is calculated by the computer so as to drive the automatic registration member 50 and the screen 10 thereon moves synchronously in the X, Y, Y directions of the plane. Thus the target 11 of the screen 10 is quickly and accurately positioned to the target of the article 20 to be printed for performing screen printing. Therefore, the positioning between the screen 10 and the article to be printed 20 on the printing table 40 is achieved automatically, quickly and accurately.

Additional advantages and modifications will readily occur to those skilled in the art. Therefore, the invention in its broader aspects is not limited to the specific details, and representative devices shown and described herein.

Accordingly, various modifications may be made without departing from the spirit or scope of the general inventive concept as defined by the appended claims and their equivalents.

What is claimed is:

1. An automatic registration device applied to screen printing machines for facilitating accurate positioning between screens and articles to be printed comprising a base, a printing table and an automatic registration member, wherein the base is disposed under the printing table and a support seat is on the center of the base for connecting and supporting a bottom of the printing table; at least three sets of image capture devices for taking pictures are arranged on an outer circumference of the support seat of the base and two sets of the image capture devices are disposed on one side of the base while the other one set of the image capture devices is disposed on the other side of the base;

the printing table is for loading and positioning the articles to be printed and is disposed with a plurality of through holes corresponding to the image capture devices respectively and a light source is disposed on a circumference of the bottom of the printing table, corresponding to each image capture device, for emitting light upward and the light passing the through hole;

the automatic registration member is arranged over the printing table and is disposed with a screen that is synchronously driven by the automatic registration member to move in X, Y, Y directions of a plane;

wherein the image capture devices take an image of a target of the article to be printed and an image of a target of the screen simultaneously through the through hole;

data of the images is calculated by a computer so as to drive the automatic registration member and the screen thereon moving for making the screen positioning to the article to be printed.

2. The device as claimed in claim 1, wherein five sets of image capture devices are disposed on the outer circumference of the support seat of the base while the two sets of image capture devices are disposed on one side of the rectangular base and the other three sets of image capture devices are arranged on the other three sides of the rectangular base respectively so that the five sets of image capture devices take images upwards through the corresponding through holes.

3. The device as claimed in claim 1, wherein each image capture device is a charge coupled device (CCD).

4. The device as claimed in claim 1, wherein the support seat further includes a lift mechanism having a motor, a crankshaft, a sliding seat, two fixed seats for rail and a top plate connecting and corresponding to the bottom of the printing table; by the synchronous driving of the motor, the crankshaft is driven to make the sliding seat move upward/downward in the two fixed seats for rail.

5. The device as claimed in claim 1, wherein each image capture device is disposed with a shifting member that drives each image capture device to move along the X direction or the Y direction on the plane for corresponding to the article to be printed with various sizes.

6. The device as claimed in claim 5, wherein the shifting member comprising a pneumatic cylinder and a sliding part and by extension and contraction movement of the pneumatic cylinder, each image capture device is driven to move inside the sliding part.

7. The device as claimed in claim 1, wherein the light source is a stroboscopic light source.

8. The device as claimed in claim 1, wherein each through hole is disposed with a transparent member made from general glass, crystal glass, or acrylic.

9. The device as claimed in claim 1, wherein a plurality of drivers along X and Y directions are arranged on a base of the automatic registration member so as to drive the automatic registration member with the screen thereon to move into the X, Y, Y directions.

10. The device as claimed in claim 9, wherein the drivers are a servomotors or a stepper motors.

* * * * *